United States Patent [19]

Walter

[11] Patent Number: 5,442,312
[45] Date of Patent: Aug. 15, 1995

[54] INTEGRATED CIRCUIT FOR GENERATING A RESET SIGNAL

[75] Inventor: Rudolph Walter, Munich, Germany

[73] Assignee: Siemens AG, Munich, Germany

[21] Appl. No.: 129,959

[22] Filed: Sep. 30, 1993

[30] Foreign Application Priority Data

Sep. 30, 1992 [EP] European Pat. Off. .......... 92116741

[51] Int. Cl.⁶ .................... H03K 17/22; H03K 5/153; H03K 17/22
[52] U.S. Cl. .................... 327/198; 327/546; 327/392; 327/394; 327/143
[58] Field of Search .................. 307/296.5, 272.3, 350, 307/443, 592, 594, 597, 585, 443, 264

[56] References Cited

U.S. PATENT DOCUMENTS

| | | | |
|---|---|---|---|
| 4,633,107 | 12/1986 | Norsworthy | 307/592 |
| 4,948,995 | 8/1990 | Takahashi | 307/594 |
| 4,983,857 | 1/1991 | Steele | 307/272.3 |

FOREIGN PATENT DOCUMENTS

| | | |
|---|---|---|
| 0090330 | 10/1983 | European Pat. Off. . |
| 0096531 | 12/1983 | European Pat. Off. . |
| 0496018 | 7/1992 | European Pat. Off. . |

OTHER PUBLICATIONS

European Search Report.

*Primary Examiner*—William L. Sikes
*Assistant Examiner*—Fetsum Abraham
*Attorney, Agent, or Firm*—Herbert L. Lerner; Laurence A. Greenberg

[57] ABSTRACT

An integrated circuit for generating a reset signal includes a circuit part having two first transistors being connected in series between terminals for a first and a second supply potential and each having a respective one of first and second mutually complementary channel types. A serial network acting as a voltage divider circuit is connected between the terminals for the first and the second supply potentials. The serial network includes at least two second transistors each having a respective one of the mutually complementary channel types and at least one element having a voltage drop during operation. The sources of the transistors of the first channel type are connected to the terminal for the first supply potential. The sources of the transistors of the second channel type are connected to the terminal for the second supply potential. The drains of the two first transistors form a first circuit node at which a reset signal is created in operation. The gate of the second transistor of the second channel type is connected to the first circuit node. The gates of the first and second transistors of the first channel type both are connected to the drain of the second transistor of the first channel type of the serial network, forming a second circuit node. The gate of the first transistor of the second channel type is connected to the second circuit node.

14 Claims, 7 Drawing Sheets

INTEGRATED CIRCUIT FOR GENERATING A RESET SIGNAL

BACKGROUND OF THE INVENTION

1. Field of the Invention

The invention relates to an integrated circuit for generating a reset signal.

When the supply voltage of complex circuits, especially complex integrated circuits, is turned on, a danger exists that some circuit elements will assume an undefined state. However, undefined states generally cause malfunctions to the point of possible damage to the circuits or to electrical components connected to the circuits.

In order to enable such malfunctions to be precluded, what is known as a power-on reset circuit is often provided, which generates a usually single signal pulse (the so-called reset signal) when the supply voltage is applied, that is meant to put critical circuits or circuit elements intentionally into a defined outset state upon turn-on of the supply voltage, so as to avoid the above-mentioned disadvantages.

2. Summary of the Invention

It is accordingly an object of the invention to provide an integrated circuit for generating a reset signal when a supply voltage is applied, which overcomes the hereinafore-for generating a reset signal, comprising a terminal for a first supply potential and a terminal for a second supply potential; two first transistors connected in series between the terminals for the first and the second supply potentials, the first transistors each having a source, a drain and a gate and each having a respective one of first and second mutually complementary channel types; a serial network acting as a voltage divider circuit and being connected between the terminals for the first and the second supply potentials, the serial network including at least two second transistors each having a source, a drain and a gate and each having a respective one of the mutually complementary channel types, and the serial network including at least one element having a voltage drop during operation; the sources of the transistors of the first channel type being connected to the terminal for the first supply potential; the sources of the transistors of the second channel type being connected to the terminal for the second supply potential; the drains of the two first transistors forming a first circuit node at which a reset signal is created in operation; the gate of the second transistor of the second channel type being connected to the first circuit node; the gates of the first and second transistors of the first channel type both being connected to the drain of the second transistor of the first channel type of the serial network, forming a second circuit node; and the gate of the first transistor of the second channel type being connected to the second circuit node. mentioned disadvantages of the heretofore-known devices of this general type which reliably meets the following specifications:

- the circuit should function reliably in the event of both a rapid and a slow rise in the supply voltage;
- it should respond even whenever the full value of the supply voltage fails to attain, or exceeds, the supply voltage limit values specified by the manufacturer of the complex circuit;
- in the event of voltage fluctuations in the supply voltage during operation, or in other words after the supply voltage has been applied and after the ensuing already-performed reset process, reactivation of the reset signal should be reliably prevented; and
- the circuit should have as few circuit elements as possible and require as little space as possible.

Moreover, the integrated circuit to be provided should be capable of acting as a component of a complex integrated circuit.

With the foregoing and other objects in view there is provided, in accordance with the invention, an integrated circuit In accordance with another feature of the invention, the at least one element having a voltage drop during operation is at least first and second elements, and the gate of the first transistor of the second channel type is connected to at least the second element form a third circuit node and is connected through at least the second element to the second circuit node.

In accordance with a further feature of the invention, the gate of at least one of the two first transistors is coupled capacitively to the second supply potential.

In accordance with an added feature of the invention, the first circuit node is coupled capacitively to the first supply potential.

In accordance with an additional feature of the invention, at least one of the at least one element having the voltage drop in operation is an ohmic resistor.

In accordance with yet another feature of the invention, at least one of the at least one element having the voltage drop in operation is a diode.

In accordance with yet a further feature of the invention, the at least one diode is a transistor having an interconnected gate and drain.

With the objects of the invention in view, there is also provided an integrated circuit for generating reset signals, comprising a first circuit part being constructed in accordance with the integrated circuit for generating a reset signal; a second circuit part being constructed in accordance with the integrated circuit for generating a reset signal, except that the second circuit node of the second circuit part is connected to the first circuit node of the first circuit part, instead of a connection between the terminal for the first supply potential and the second circuit node through a second transistor of the first channel type; and the reset signals are created at the first circuit node of the circuits parts.

In accordance with another feature of the invention, there is provided an inverter connected between the second circuit node of the second circuit part and the first circuit node of the first circuit part.

In accordance with a further feature of the invention, the inverter is a component of the serial network of the second circuit part.

In accordance with an added feature of the invention, there is provided a further circuit part being constructed identically to the second circuit part, the second circuit node of the further circuit part being connected to the first circuit node of the second circuit part.

In accordance with an additional feature of the invention, there is provided a succession of further circuit parts being constructed identically to the second circuit part, the second circuit node of each of the further circuit parts being connected to the first circuit node of the preceding circuit part in the succession.

In accordance with yet another feature of the invention, there is provided a terminal for an analog potential to be digitalized instead of the terminal for the first supply potential of the first circuit part; a plurality of second circuit parts each including a second circuit node being connected to the first circuit node of the first circuit part; and the serial networks of the second circuit parts having voltage divider values differing from one another.

In accordance with a concomitant feature of the invention, there is provided a terminal for an analog potential to be digitalized instead of the terminal for the first supply potential of the first circuit part; a plurality of second circuit parts each including a second circuit node being connected to the first circuit node of the first circuit part; and instead of terminals for the first supply potential, terminals for reference potentials carry a different reference potential for each of the second circuit parts.

Other features which are considered as characteristic for the invention are set forth in the appended claims.

Although the invention is illustrated and described herein as embodied in an integrated circuit for generating a reset signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawing in detail and first, particularly, to FIG. 1 thereof, there is seen a basic structure of an integrated circuit according to the invention, but which is already expanded by two capacitors (to be described below), forming an advantageous embodiment of the basic structure. In its basic structure, the circuit according to the invention includes two first transistors Q1, Q2 having channel types that are complementary to one another. One first transistor Q1 is of the first or p-channel type. Correspondingly, the other first transistor Q2 is of the second or n-channel type. The two first transistors Q1, Q2 are connected in series with one another by their channel paths and are disposed between terminals for a first supply potential VDD and a second supply potential VSS. In the present and following examples, it is assumed that the first supply potential VDD has a more-positive value during operation than the second supply potential VSS. A serial network N, which acts as a voltage divider circuit, is also disposed between the terminals for the two supply potentials VDD, VSS, parallel to the two first transistors Q1, Q2. This network N includes two second transistors Q3, Q4, which are likewise of opposite channel types. One second transistor Q3 is of the first or p-channel type, while the other second transistor Q4 is of the second or n-channel type. A resistor R1 is disposed between the two second transistors Q3, Q4. During operation, a voltage drops at this resistor R1, as it does along the channel paths of the two second transistors Q3, Q4. However, the voltage drop along the resistor R1, as is well-known to anyone in the art, depends primarily on the nature (that is, its dimensioning, for instance) of the resistor R1, while the voltage drops along the second transistors Q3, Q4 depend primarily on whether their channel paths are switched through (low-impedance track resistance) or blocked (high-impedance track resistance). In contrast to the resistance of the resistor R1, the resistances of the second transistors Q3, Q4 are switchable, that is they are variable in a non-steady manner by operating conditions.

Sources of the two transistors Q1, Q3 of the first channel type are connected to the terminal for the first supply potential VDD. Sources of the two transistors Q2, Q4 of the second channel type are connected to the terminal for the second supply potential VSS.

Drains of the two first transistors Q1, Q2 form a first circuit node N1. In operation, a reset signal OUT is present at this node N1. Moreover, the first circuit node N1 is connected to a gate of the second transistor Q4 of the second channel type, so that in operation the reset signal OUT is fed back to the gate of the second transistor Q4 of the second channel type and controls this transistor Q4.

Gates of the first and second transistors Q1, Q3 of the first channel type are both connected to a drain of the second transistor Q3 of the first channel type, forming a second circuit node N2. The first and second transistors Q1, Q3 of the first channel type thus act as a current mirror circuit.

Figure 1:
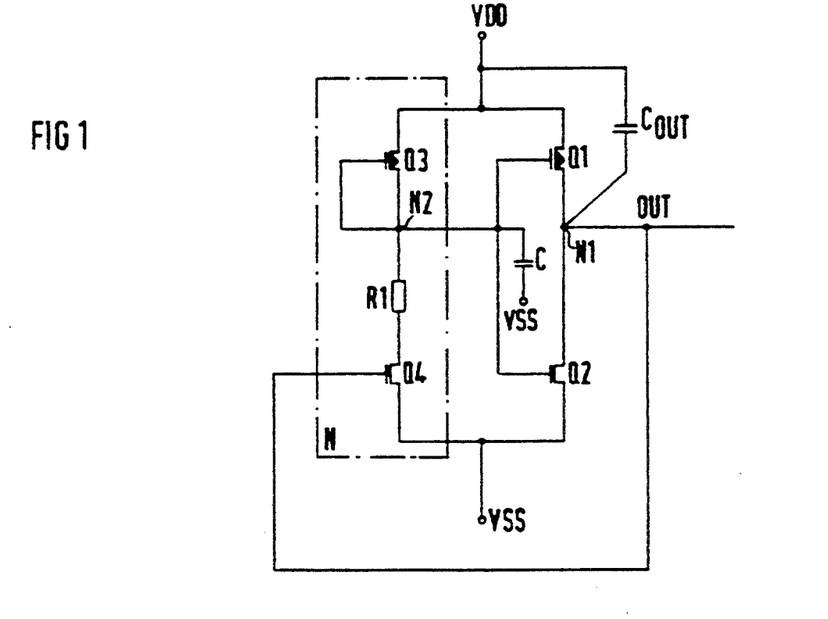
FIGS. 1-10 are schematic circuit diagrams showing advantageous features and applications of the invention.

In the embodiment of FIG. 1, a gate of the first transistor Q2 of the second channel type is connected directly to the second circuit node N2, so that in this embodiment the two first transistors Q1, Q2 form a CMOS inverter.

Besides this basic structure of the circuit according to the invention, the circuit of FIG. 1 also has a capacitor C, which is disposed between the gates of the two first transistors Q1, Q2 on one hand and the second supply potential VSS on the other hand, as well as a further capacitor $C_{OUT}$, which is disposed between the first circuit node N1 and the first supply potential VDD. The capacitors C, $C_{OUT}$ serve to filter out any interference signals that might arrive at the various circuit nodes N1, N2, or in other words serve to smooth out undesired interfering voltage peaks, for instance.

The circuit of the invention as shown in FIG. 1 functions as follows:

First, it is assumed that both supply potentials VDD, VSS have the value "ground". The second supply potential VSS keeps this value as operation continues. Conversely, the first supply potential VDD is "turned on". In other words, the potential value at the terminal for the first supply potential VDD rises, beginning at the potential of the second supply potential VSS, until reaching the desired final value of the first supply potential VDD, such as 3 V or 5 V.

The two circuit nodes N1, N2 initially have the value at that time, i.e. the current or present value, of the first supply potential VDD. In other words, beginning at the value of the second supply potential VSS, the potential values at the two circuit nodes N1, N2 rise with the rise of the first supply potential VDD. Thus the reset signal OUT also has a leading edge. This continues until such time as the reset signal OUT has a value at which the second transistor Q4 of the second channel type, which of course is a component of the serial network N acting as a voltage divider circuit, becomes conducting because of the application of the reset signal OUT at its (Q4) gate. This instant can be designated t1. At the time t1, the voltage conditions of the various elements of the network N accordingly vary, because the drain of the second transistor Q4 of the second channel type is pulled in the direction of the second supply potential VSS, or in other words in the direction of ground. Thus, although because of the resistor R1 the potential at the second circuit node N2 drops in the direction of the value of the second supply potential VSS, it does so only to a very slight extent, as compared with the state in which the second transistor Q4 of the second channel type blocks.

From the time t1 on, because of the current mirror property of the two transistors Q1, Q3 of the first channel type (which are electrically conducting) and because of the voltage divider property of the serial network N, the two circuit nodes N1, N2 thus have a potential which is lower than the current value of the first supply potential VDD. If a further rise in the value of the first supply potential VDD occurs, then the potential at the two circuit nodes N1, N2 rises further as well, although only up to a value at which the first transistor Q2 of the second channel type becomes conducting. This time can be designated as t2. If then (at the time t2) the first transistor Q2 of the second channel type becomes electrically conductive, then the second supply potential VSS is switched through to the first circuit node N1, so that the reset signal OUT drops to approximately the value of the second supply potential VSS. Then, however, the second transistor Q4 of the second channel type is blocked again also. Due to the voltage divider property of the serial network N, the effect of this on the second circuit node N2 is that its potential rises again in the direction of the value of the first supply potential VDD. This switches through the first transistor Q2 of the second channel type even more strongly.

Once the potential at the second circuit node N2 has risen up to a value that differs from the current or present value of the first supply potential VDD at most by the value of the operating voltage of the two transistors Q1, Q3 of the first channel type, then these two transistors Q1, Q3 block, so that on one hand no transverse current can flow (any longer) between the terminals for the supply potentials VSS, VDD through the circuit according to the invention, and that on the other hand, the reset signal OUT always has approximately the value of the second supply potential VSS: if in fact the potential at the second circuit node N2 should drop in the direction of the second supply potential VSS (which would present the danger that the first transistor Q2 of the second channel type would be blocked again), then the second transistor Q3 of the first channel type would begin to conduct, so that the potential at the second circuit node would rise again in the direction of the value of the first supply potential VDD. But then, the first transistor Q2 of the second channel type remains electrically conducting and the reset signal OUT remains at its (low) value.

The circuit according to the invention has the following advantages, which can easily be achieved from the above description:

The particular value of the first supply potential VDD at which the first transistor Q2 of the second channel type changes from the blocked state to the conducting state (and at which accordingly the reset signal OUT assumes a potential value that substantially corresponds to the value of the second supply potential VSS) is easily definable by defining the voltage divider ratios, that is by suitable dimensioning of the elements of the serial network N, namely by defining the track resistances of the second transistors Q3, Q4 in the conducting state and by defining the resistance of the ohmic resistor R1. If the circuit according to the invention is used as a so-called "power-on detection" circuit, then it is possible, by simple means, to define the value of the first supply potential VDD that is to be detected as a "power-on".

Moreover, the circuit is functionally very reliable, because at the beginning of turn-on of the first supply potential VDD, all of the circuit nodes of the circuit are defined in terms of potential (second supply potential VSS).

Moreover, the circuit of the invention is independent of the rise time of the first supply potential VDD, or in other words is independent of whether the first supply potential VDD rises rapidly or slowly upon turn-on. This independence is assured in that (because of the voltage divider function of the serial network N), the second transistor Q4 of the second channel type is also made conducting earlier than the first transistor Q2 of the second channel type.

Figure 2:
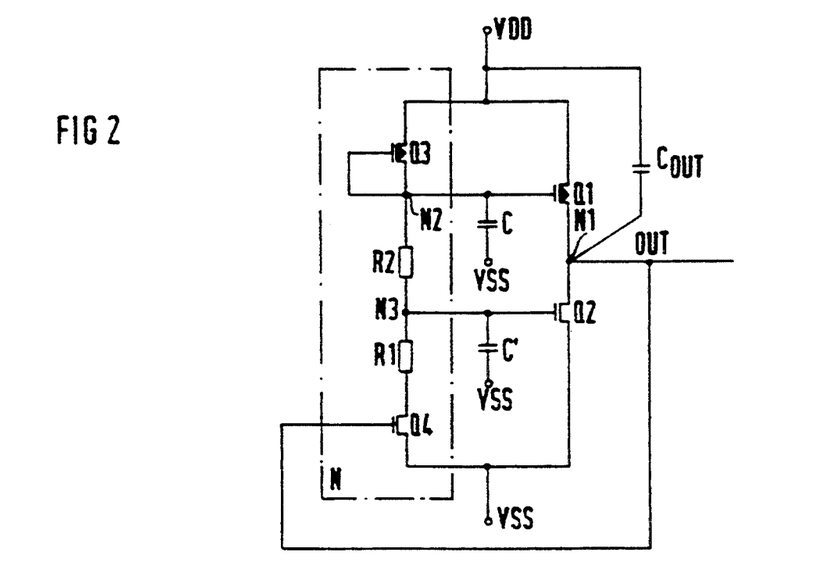

FIG. 2 shows an advantageous further refinement of the circuit of the invention, in which the gate of the first transistor Q2 of the second channel type is connected to the second circuit node N2 through a second resistor R2. Accordingly, in the embodiment of FIG. 2, the serial network N, with its voltage divider property, is formed from a series circuit of the second transistor Q3 of the first channel type, the two resistors R2, R1, and the second transistor Q4 of the second channel type. A connecting point between the gate of the first transistor Q2 of the second channel type and the two resistors R1, R2 forms a third circuit node N3. Analogously to the corresponding embodiment of the circuit of FIG. 1 and for the same purpose, the gate of the first transistor Q2 of the second channel type is advantageously connected to the second supply potential VSS through a capacitor C'. In this embodiment, potentials differing from one another are accordingly present at the gates of the two first transistors Q1, Q2, so that the overall circuit can be dimensioned even more simply for the intended uses than that of FIG. 1.

Figure 3:
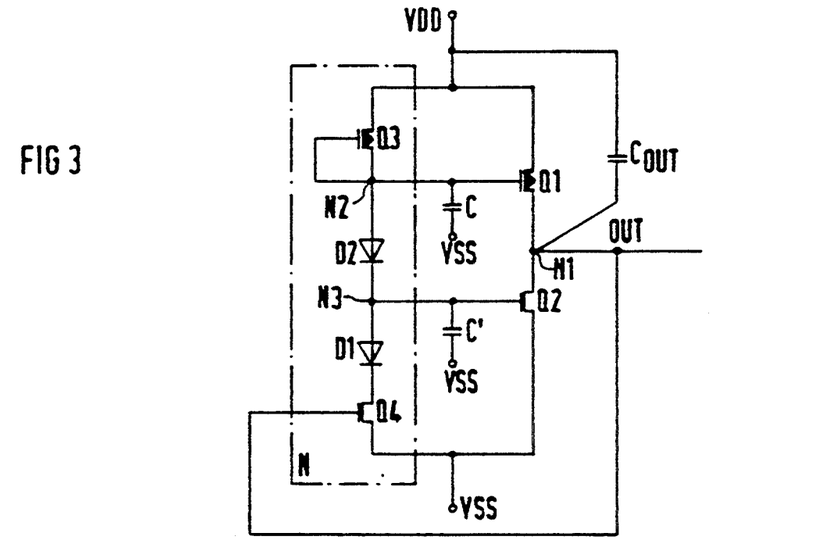

In the embodiment of FIG. 3, the resistors R1, R2 are replaced by diodes D1, D2. Thus in operation, precisely definable voltage drops (along the diodes D1, D2) can likewise be attained. Beyond a value of the first supply potential VDD that is specified by the dimensioning of the overall circuit, these voltage drops are independent of the current or present value of the first supply potential VDD.

Figure 4:
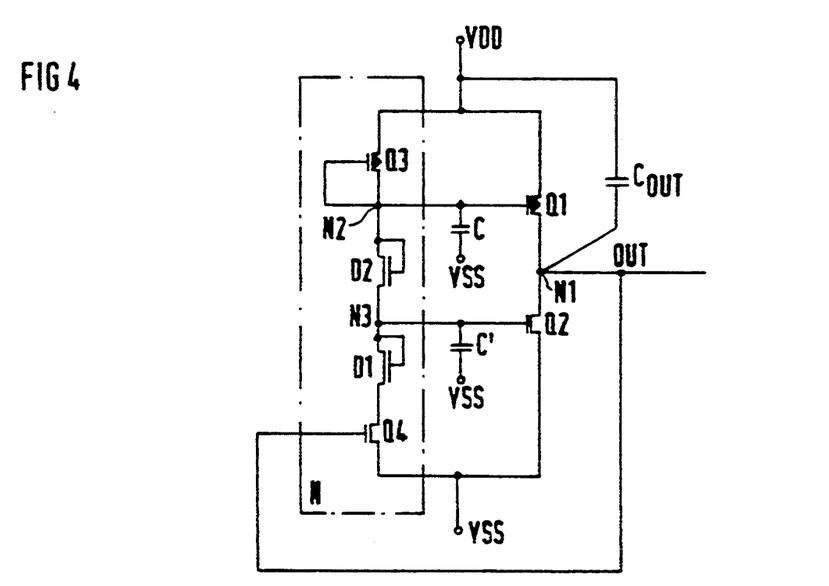
Figure 5:
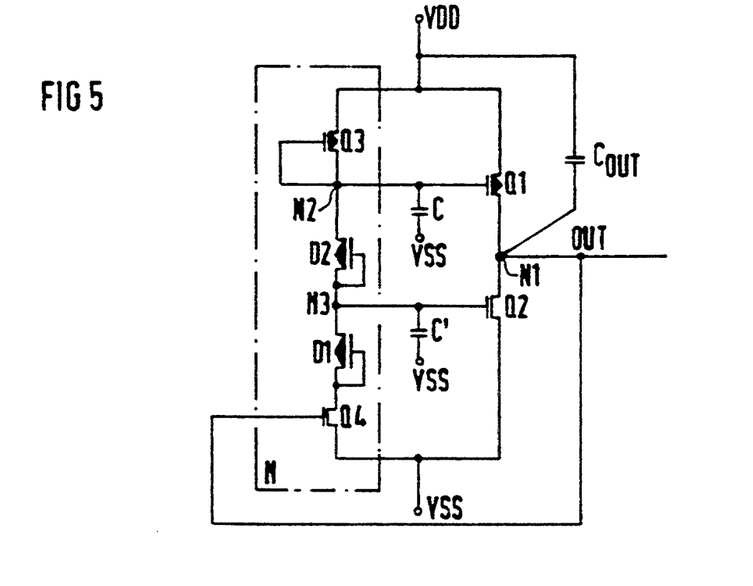

In FIGS. 4 and 5, the diodes D1 and D2 are constructed as respective transistors of the n-channel and p-channel type having drains that are each connected to the associated gate. It is also possible to provide one series circuit each having one diode D1 (or D2) and one resistor R1 (or R2), instead of a respective diode D1, D2 or a respective resistor R1, R2.

Some advantageous possible applications of the circuit of the invention will be described below in conjunction with FIGS. 6–10.

Figure 6:
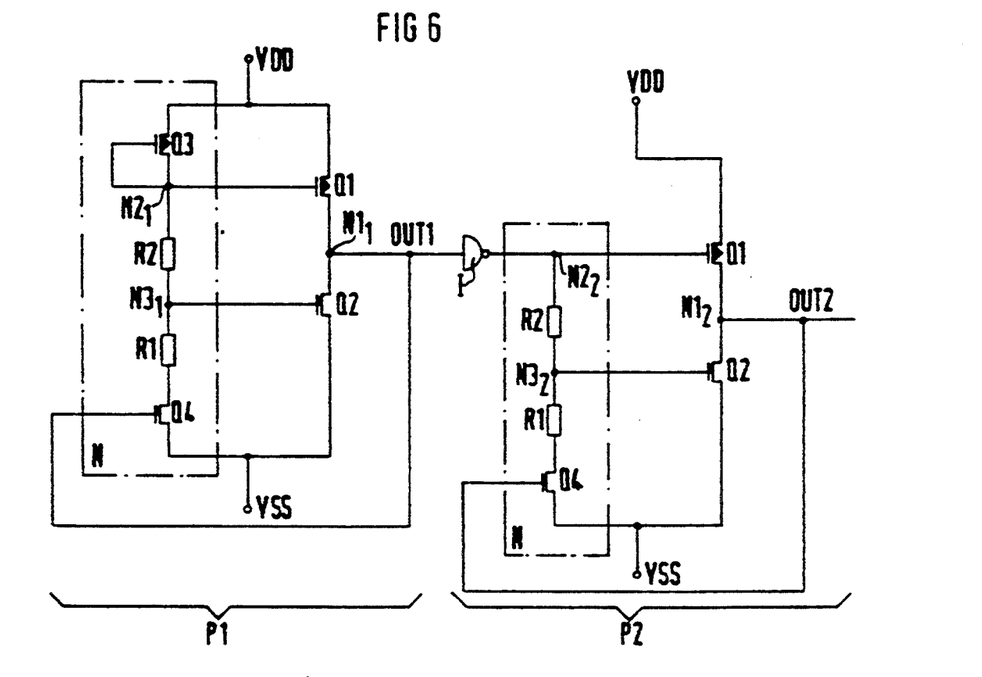

The embodiment of FIG. 6 serves to generate a plurality of different reset signals OUT1, OUT2. It includes a first circuit part P1, which may be constructed in accordance with one of the embodiments already described above, for instance that of FIG. 2 (although the capacitors C, C', $C_{OUT}$ are then omitted). A second circuit part P2 is connected downstream of the first circuit part P1, i.e., follows it. The second circuit part P2 is constructed identically to the first circuit part, and therefore identically to the basic structure of the integrated circuit of the invention, with the following exception: In the serial network N, the one second transistor Q3 of the first channel type is omitted. Instead, a second circuit node $N2_2$ of the second circuit part P2 is connected to a first circuit node N1 of the first circuit part P1. The connection may be provided either directly or through an inverter I, as shown. The inverter I may then act as a component of the serial network N, in accordance with the one second transistor Q3 of FIG. 2. It is also possible for the connection to be provided by means of a transistor being connected as a diode. During operation, the first reset signal OUT1 is created at the first circuit node $N1_1$ of the first circuit part P1. This signal serves simultaneously as an input signal for the second circuit part P2. The second reset signal OUT2 is created at a first circuit node $N1_2$ of the second circuit part P2. With such a configuration, two reset signals OUT1, OUT2 can be generated in cascaded fashion, with the second reset signal OUT2 being dependent on the appearance of the first reset signal OUT1. The appearance of each of these reset signals OUT1, OUT2 is also dependent on the dimensioning of its own associated circuit part P1 and P2, respectively.

Figure 7:
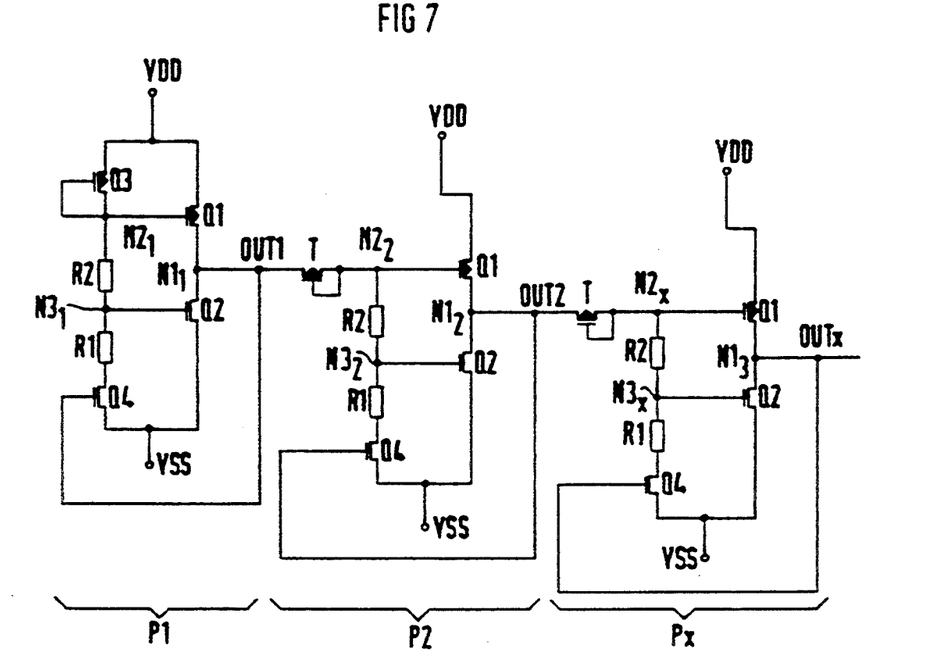
Figure 8:
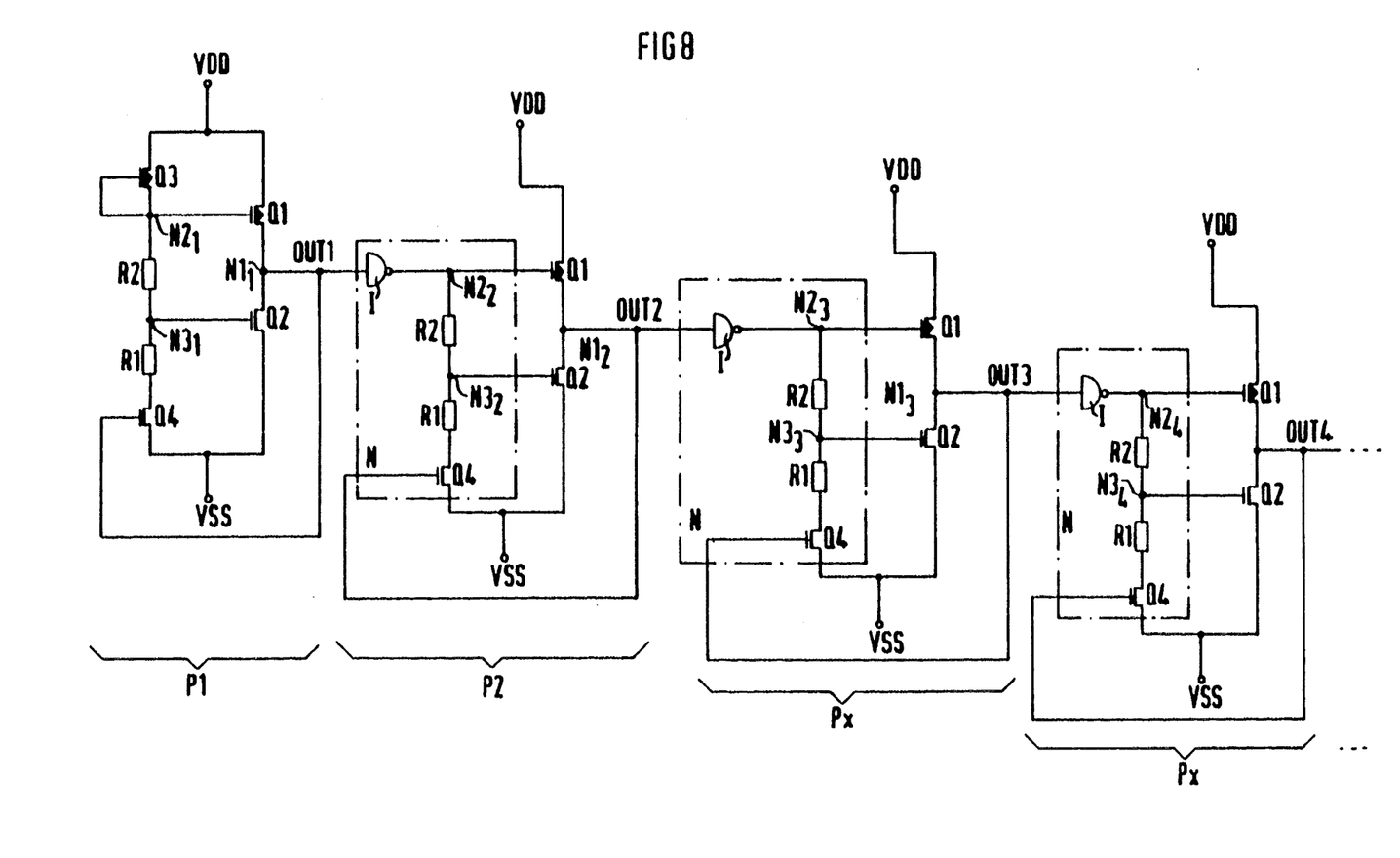

FIG. 7 shows a further example for cascading of the circuit of the invention: This application includes a first circuit part P1 and a second circuit part P2, being disposed as in the example of FIG. 6. The second circuit part P2 is followed by a further circuit part Px. The further circuit part Px is constructed identically to the second circuit part P2. The further circuit part Px follows the second circuit part P2 in the same way as the second circuit part P2 follows the first circuit part P1. This cascading of the circuit parts P1, P2, Px can be continued with more than one further circuit part Px, as is illustrated in FIG. 8 with a total of two further circuit parts Px. FIG. 7 also shows that the inverter I of the second circuit part P2 or the further circuit part Px can be replaced by a transistor T having a gate that is connected to its drain.

Figure 9:
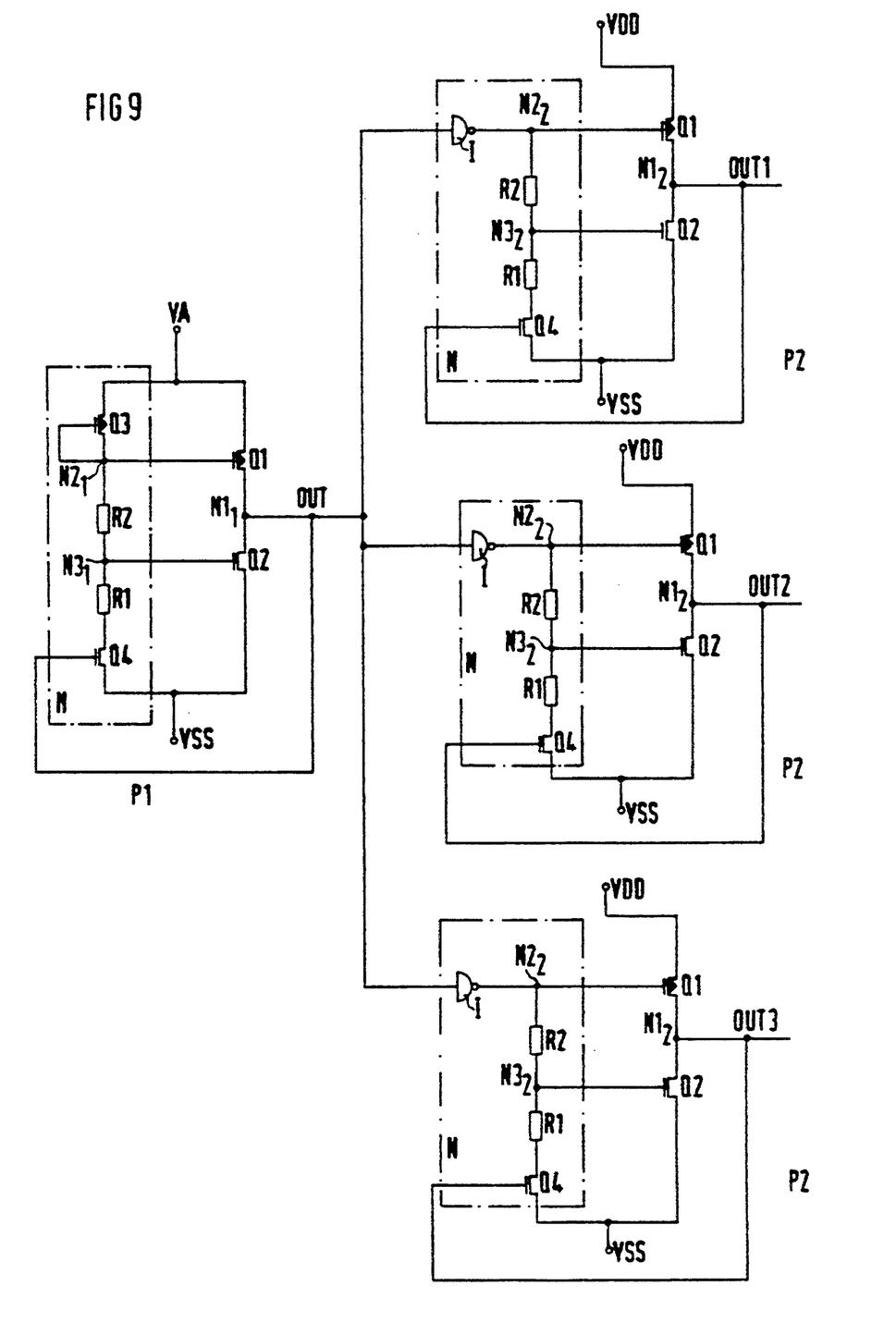

FIG. 9 shows another advantageous application of the circuit of the invention, namely as an analog/digital converter circuit. This circuit has a first circuit part P1 and (for example) three second circuit parts P2. The first circuit part P1 is constructed identically to the first circuit part P1 in FIG. 6, by way of example. However, its terminal for the first supply potential VDD is not connected to VDD during operation, but rather to an analog potential VA that is to be digitalized. The second circuit parts P2 are constructed identically to the second circuit part P2 in FIG. 6, for example. However, the elements of the second circuit parts P2, and particularly those of the applicable serial network N, are dimensioned differently from one second circuit part P2 to the next second circuit part P2. The second circuit parts P2 are interconnected at their inputs: Their second circuit nodes $N2_2$ are each connected to the first circuit node $N1_1$ of the first circuit part P1, for instance (as shown) through inverters I. In operation, given suitable dimensioning of the circuit parts P1, P2, the reset signals OUT1, OUT2, OUT3 occur as a function of the value of the analog potential VA that is applied to the first circuit part P1 and is to be digitalized.

Figure 10:
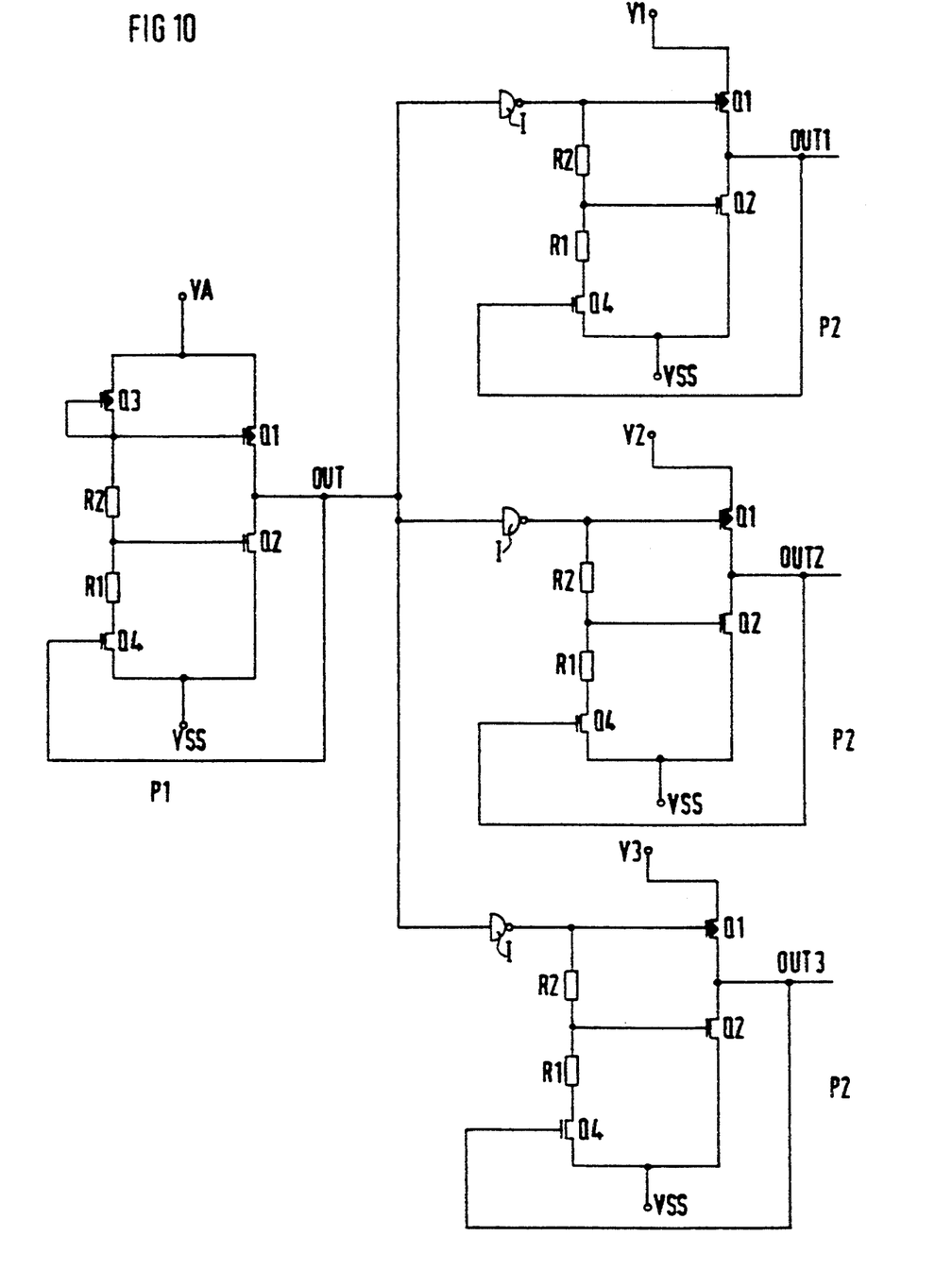

FIG. 10 shows a configuration corresponding to FIG. 9, except that in the second circuit parts P2 the terminal for the first supply potential VDD is not connected to the first supply potential VDD but rather to a respective reference potential V1, V2, V3. The reference potentials V1, V2, V3 are different from one another. The serial networks N of the second circuit parts P2 may be dimensioned differently from one another, as in the configuration of FIG. 9. However, they may also be constructed identically to one another. Once again, given suitable dimensioning of the circuit parts P1, P2 and the reference potentials V1, V2, V3, in operation the reset signals OUT1, OUT2, OUT3 occur as a function of the value of the analog potential VA that is applied to the first circuit part P1 and is to be digitalized.

The inverters shown in FIGS. 6-10 are each a component of the applicable serial network N. Their dimensioning accordingly affects the voltage divider property of the applicable serial network N.

I claim:

1. An integrated circuit for generating a reset signal, comprising:
    a terminal for a first supply potential and a terminal for a second supply potential;
    two first transistors connected in series between said terminals for the first and the second supply potentials, said first transistors each having a source, a drain and a gate and each having a respective one of first and second mutually complementary channel types;
    a serial network acting as a voltage divider circuit and being connected between said terminals for the first and the second supply potentials, said serial network including at least two second transistors each having a source, a drain and a gate and each having a respective one of the mutually complementary channel types, and said serial network including at least one element having a voltage drop during operation;
    the sources of said transistors of the first channel type being connected to said terminal for the first supply potential; the sources of said transistors of the second channel type being connected to said terminal for the second supply potential;
    the drains of said two first transistors forming a first circuit node at which a reset signal is created in operation;
    the gate of said second transistor of the second channel type being connected to said first circuit node;
    the gates of said first and second transistors of the first channel type both being connected to the drain of said second transistor of the first channel type of said serial network, forming a second circuit node; and
    the gate of said first transistor of the second channel type being connected to the second circuit node.

2. The integrated circuit according to claim 1, wherein said at least one element having a voltage drop during operation is at least first and second elements, and the gate of said first transistor of the second channel type is connected to at least said second element form a third circuit node and is connected through at least said second element to said second circuit node.

3. The integrated circuit according to claim 1, wherein the gate of at least one of said two first transistors is coupled capacitively to the second supply potential.

4. The integrated circuit according to claim 1, wherein said first circuit node is coupled capacitively to the first supply potential.

5. The integrated circuit according to claim 1, wherein at least one of said at least one element having the voltage drop in operation is an ohmic resistor.

6. The integrated circuit according to claim 1, wherein at least one of said at least one element having the voltage drop in operation is a diode.

7. The integrated circuit according to claim 6, wherein said at least one diode is a transistor having an interconnected gate and drain.

8. An integrated circuit for generating reset signals, comprising:
a first circuit part including:
   a terminal for a first supply potential and a terminal for a second supply potential;
   two first, transistors connected in series between said terminals for the first and the second supply potentials, said first transistors each having a source, a drain and a gate and each having a respective one of first and second mutually complementary channel types;
   a serial network acting as a voltage divider circuit and being connected between said terminals for the first and the second supply potentials, said serial network including at least two second,transistors each having a source, a drain and a gate and each having a respective one of the mutually complementary channel types, and said serial network including at least one element having a voltage drop during operation;
   the sources of said transistors of the first channel type being connected to said terminal four the first supply potential;
   the sources of said transistors of the second channel type being connected to said terminal for the second supply potential;
   the drains of said two first transistors forming a first circuit node at which a reset signal is created in operation;
   the gate of said second transistor of the second channel type being connected to said first circuit node;
   the gates of said first and second transistors of the first channel type both being connected to the drain of said second transistor of the first channel type of said serial network, forming a second circuit node, and
   the gate of said first transistor of the second channel type being connected to the second circuit node;
a second circuit part including:
   a terminal for the first supply potential and a terminal for the second supply potential;
   two first transistors connected in series between said terminals for the first and the second supply potentials, said first transistors each having a source, a drain and a gate and each having a respective one of the first and second mutually complementary channel types;
   a serial network acting as a voltage divider circuit and including a second transistor having a source, a drain and a gate and having the second channel type, said serial network including at least one element having a voltage drop during operation;
   the source of said first transistor of the first channel type being connected to said terminal for the first supply potential;
   the sources of said transistors of the second channel type being connected to said terminal for the second supply potential;
   the drains of said two first transistors forming a first circuit node at which a reset signal is created in operation;
   the gate of said second transistor of the second channel type being connected to said first circuit node;
   the gate of said first transistor of the first channel type forming a second circuit node; and
   the gate of said first transistor of the second channel type being connected to the second circuit node; and
said second circuit node of said second circuit part being connected to said first circuit node of said first circuit part.

9. The integrated circuit according to claim 8, including an inverter connected between said second circuit node of said second circuit part and said first circuit node of said first circuit part.

10. The integrated circuit according to claim 9, wherein said inverter is a component of said serial network of said second circuit part.

11. The integrated circuit according to claim 8, including a further circuit part being constructed identically to said second circuit part, said second circuit node of said further circuit part being connected to said first circuit node of said second circuit part.

12. The integrated circuit according to claim 8, including a succession of further circuit parts being constructed identically to said second circuit part, said second circuit node of each of said further circuit parts being connected to said first circuit node of said preceding circuit part in said succession.

13. An integrated circuit for generating reset signals, comprising:
a first circuit part including:
   a terminal for an analog potential to be digitalized and a terminal for a second supply potential;
   two first transistors connected in series between said terminal for the analog potential and said terminal for the second supply potential, said first transistors each having a source, a drain and a gate and each having a respective one of first and second mutually complementary channel types;
   a serial network acting as a voltage divider circuit and being connected between said terminal for the analog potential and said terminal for the second supply potential, said serial network including at least two second transistors each having a source, a drain and a gate and each having a respective one of the mutually complementary channel types, and said serial network including at least one element having a voltage drop during operation;
   the sources of said transistors of the first channel type being connected to said terminal for the analog potential;
   the sources of said transistors of the second channel type being connected to said terminal for the second supply potential;
   the drains of said two first transistors forming a first circuit node at which a reset signal is created in operation;
   the gate of said second transistor of the second channel type being connected to said first circuit node;
   the gates of said first and second transistors of the first channel type both being connected to the drain of said second transistor of the first channel type of said serial network, forming a second circuit node; and the gate of said first transistor of the second channel type being connected to the second circuit node;

a plurality of second circuit parts each including:

a terminal for a first supply potential and a terminal for the second supply potential;

two first transistors connected in series between said terminals for the first and the second supply potentials, said first transistors each having a source, a drain and a gate and each having a respective one of the first and second mutually complementary channel types;

a serial network acting as a voltage divider circuit and including a second transistor having a source, a drain and a gate and having the second channel type, said serial network including at least one element having a voltage drop during operation;

the source of said first transistor of the first channel type being connected to said terminal for the first supply potential;

the sources of said transistors of the second channel type being connected to said terminal for the second supply potential;

the drains of said two first transistors forming a first circuit node at which a reset signal is created in operation;

the gate of said second transistor of the second channel type being connected to said first circuit node;

the gate of said first transistor of the first channel type forming a second circuit node; and the gate of said first transistor of the second channel type being connected to the second circuit node;

said serial networks of said second circuit parts having voltage divider values differing from one another; and said second circuit node of each of said second circuit parts being connected to said -first circuit node of said first circuit part.

14. An integrated circuit for generating reset signals, comprising:

a first circuit part including:

a terminal for an analog potential to be digitalized and a terminal for a second supply potential;

two first transistors connected in series between said terminal for the analog potential and said terminal for the second supply potential, said first transistors each having a source, a drain and a gate and each having a respective one of first and second mutually complementary channel types;

a serial network acting as a voltage divider circuit and being connected between said terminal for the analog potential and said terminal for the second supply potential, said serial network including at least two second transistors each having a source, a drain and a gate and each having a respective one of the mutually complementary channel types, and said serial network including at least one element having a voltage drop during operation;

the sources of said transistors of the first channel type being connected to said terminal for the analog potential;

the sources of said transistors of the second channel type being connected to said terminal for the second supply potential;

the drains of said two first transistors forming a first circuit node at which a reset signal is created in operation;

the gate of said second transistor of the second channel type being connected to said first circuit node;

the gates of said first and second transistors of the first channel type both being connected to the drain of said second transistor of the first channel type of said serial network, forming a second circuit node; and the gate of said first transistor of the second channel type being connected to the second circuit node;

a plurality of second circuit parts each including:

a terminal for a reference potential and a terminal for the second supply potential;

two first transistors connected in series between said terminal for the reference potential and said terminal for the second supply potential, said first transistors each having a source, a drain and a gate and each having a respective one of the first and second mutually complementary channel types;

a serial network acting as a voltage divider circuit and including a second transistor having a source, a drain and a gate and having the second channel type, said serial network including at least one element having a voltage drop during operation;

the source of said first transistor of the first channel type being connected to said terminal for the reference potential;

the sources of said transistors of the second channel type being connected to said terminal for the second supply potential;

the drains of said two first transistors forming a first circuit node at which a reset signal is created in operation;

the gate of said second transistor of the second channel type being connected to said first circuit node;

the gate of said first transistor of the first channel type forming a second circuit node; and the gate of said first transistor of the second channel type being connected to the second circuit node;

the terminal for the reference potential of each of said second circuit parts carrying a different reference potential; and said second circuit node of each of said second circuit parts being connected to said first circuit node of said first circuit part.

* * * * *